United States Patent
Baryudin et al.

(10) Patent No.: US 8,972,776 B2
(45) Date of Patent: Mar. 3, 2015

(54) PARTIAL R-BLOCK RECYCLING

(71) Applicant: LSI Corporation, San Jose, CA (US)

(72) Inventors: Leonid Baryudin, San Jose, CA (US); Alex G. Tang, Cupertino, CA (US); Earl T. Cohen, Oakland, CA (US)

(73) Assignee: Seagate Technology, LLC, Cupertino, CA (US)

( * ) Notice: Subject to any disclaimer, the term of this patent is extended or adjusted under 35 U.S.C. 154(b) by 156 days.

(21) Appl. No.: 13/788,303

(22) Filed: Mar. 7, 2013

(65) Prior Publication Data

US 2014/0258769 A1 Sep. 11, 2014

Related U.S. Application Data

(60) Provisional application No. 61/773,437, filed on Mar. 6, 2013.

(51) Int. Cl.
*G06F 11/00* (2006.01)
*G06F 12/02* (2006.01)
*G06F 11/07* (2006.01)

(52) U.S. Cl.
CPC ............ *G06F 12/02* (2013.01); *G06F 11/0793* (2013.01)
USPC ........... 714/6.2; 714/6.13; 714/723; 714/773; 711/103

(58) Field of Classification Search
None
See application file for complete search history.

(56) References Cited

U.S. PATENT DOCUMENTS

| | | | |
|---|---|---|---|
| 7,477,547 B2 | 1/2009 | Lin | 365/185.09 |
| 7,706,182 B2 | 4/2010 | Shalvi et al. | 365/185.03 |
| 8,151,166 B2 | 4/2012 | Shalvi et al. | 714/763 |
| 8,214,700 B2 | 7/2012 | Chen | 714/721 |
| 8,239,735 B2 | 8/2012 | Shalvi et al. | 714/774 |
| 8,296,498 B2 | 10/2012 | Gorobets et al. | 711/103 |
| 2002/0099904 A1* | 7/2002 | Conley | 711/103 |
| 2002/0194530 A1* | 12/2002 | Santeler et al. | 714/6 |
| 2005/0166087 A1* | 7/2005 | Gorobets | 714/7 |
| 2008/0219053 A1* | 9/2008 | Kim | 365/185.11 |
| 2010/0131809 A1 | 5/2010 | Katz | 714/719 |
| 2010/0332949 A1 | 12/2010 | d'Abreu et al. | 714/766 |
| 2011/0040932 A1* | 2/2011 | Frost et al. | 711/103 |
| 2011/0066793 A1* | 3/2011 | Burd | 711/103 |
| 2012/0005558 A1 | 1/2012 | Steiner et al. | 714/773 |
| 2013/0173845 A1* | 7/2013 | Aslam et al. | 711/103 |

* cited by examiner

*Primary Examiner* — Gabriel Chu
(74) *Attorney, Agent, or Firm* — Christopher P. Maiorana, PC

(57) ABSTRACT

An apparatus includes a non-volatile memory and a controller. The non-volatile memory includes a plurality of R-blocks. The controller is coupled to the non-volatile memory. The controller is configured to (i) write data using the R-blocks as a unit of allocation and (ii) perform recycling operations selectively on either an entire one of the R-blocks or a portion less than all of one of the R-blocks.

20 Claims, 7 Drawing Sheets

PARTIAL R-BLOCK RECYCLING

FIELD OF THE INVENTION

The invention relates to non-volatile storage systems generally and, more particularly, to a method and/or apparatus for implementing partial R-block recycling.

BACKGROUND

In a solid-state drive (SSD) device, valid data on the media is moved to another location on the media by a process referred to as recycling. Recycling is typically done as part of either garbage collection or wear leveling. Garbage collection is performed to reclaim space taken up by stale data. Wear leveling is performed to ensure some non-volatile memory (NVM) blocks do not wear out faster than other NVM blocks due to excessive program and erase cycles. In a system where data is written in R-blocks (a combination of NVM blocks providing cross-die redundancy for higher-level error correction), the conventional recycling process recycles each R-block in its entirety.

It would be desirable to have a method and/or apparatus for implementing partial R-block recycling.

SUMMARY

The invention concerns an apparatus including a non-volatile memory and a controller. The non-volatile memory includes a plurality of R-blocks. The controller is coupled to the non-volatile memory. The controller is configured to (i) write data using the R-blocks as a unit of allocation and (ii) perform recycling operations selectively on either an entire one of the R-blocks or a portion less than all of one of the R-blocks.

BRIEF DESCRIPTION OF THE FIGURES

Embodiments of the invention will be apparent from the following detailed description and the appended claims and drawings in which:

DETAILED DESCRIPTION OF THE PREFERRED EMBODIMENTS

Embodiments of the invention include providing partial R-block recycling that may (i) allow recycling to be done at a very fine granularity, (ii) detect and handle data units spanning outside a non-volatile memory (NVM) block being recycled, and/or (iii) ensure entire valid data units are recycled.

Figure 1:
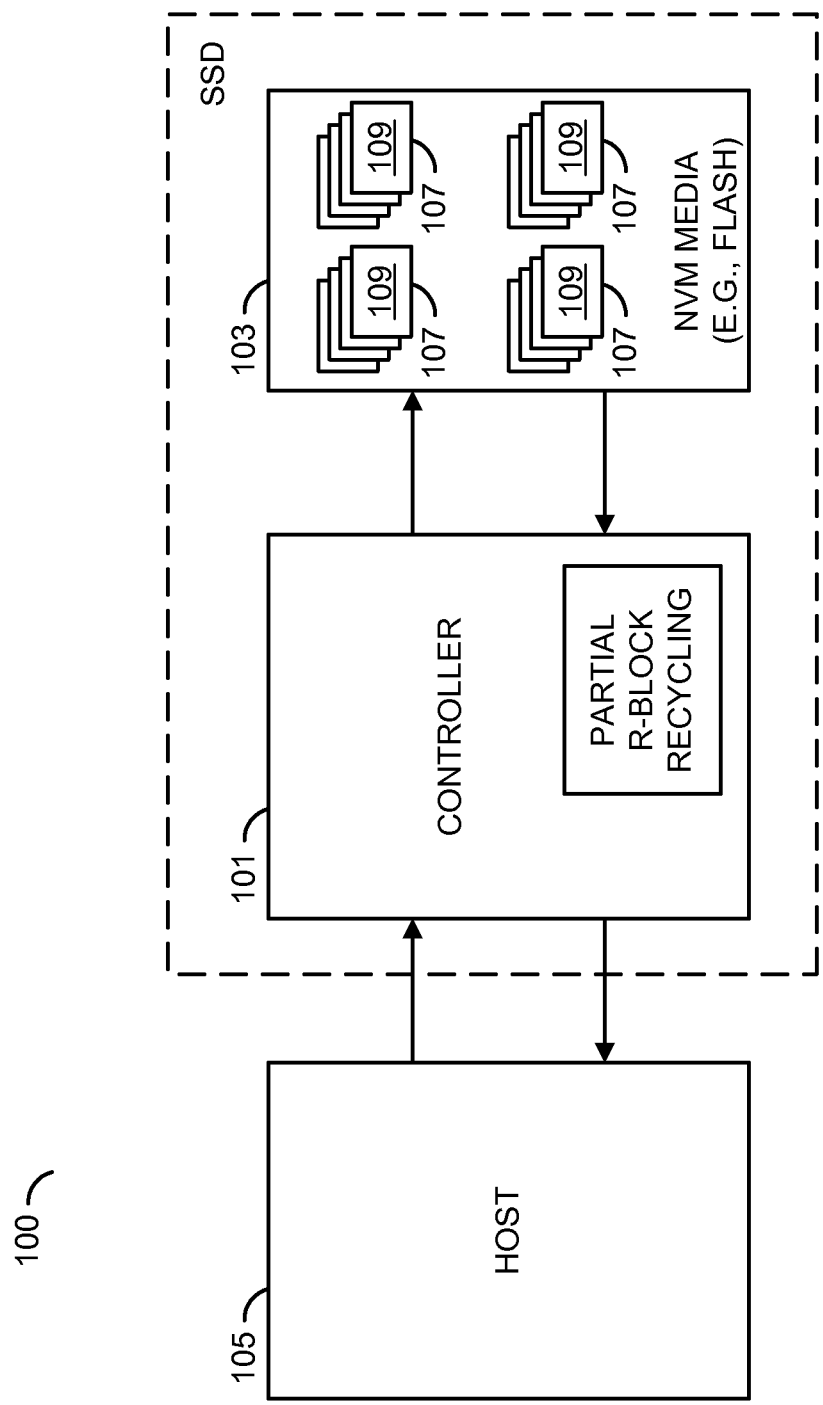
FIG. 1 is a diagram illustrating a non-volatile memory system in accordance with an embodiment of the invention.

Referring to FIG. 1, a diagram is shown illustrating a non-volatile memory system 100 in accordance with an embodiment of the invention. In various embodiments, the non-volatile memory system 100 comprises a block 101, a block 103, and a block 105. The block 101 comprises a memory controller implementing a partial R-block recycling process in accordance with an embodiment of the invention. The block 103 comprises a non-volatile memory (NVM) media. The block 105 comprises a host.

The controller 101 may be configured to control one or more individual non-volatile memory channels. In some embodiments, the controller 101 may implement multiple memory channel controller instances to control a plurality of non-volatile memory channels. The controller 101 has a non-volatile memory interface configured to couple the controller 101 to the non-volatile memory media 103. The non-volatile memory media 103 may comprises one or more non-volatile memory devices 107. The non-volatile memory devices 107 have, in some embodiments, one or more non-volatile memory die 109. According to a type of a particular one of the non-volatile memory devices 107, a plurality of non-volatile memory die 109 in the particular non-volatile memory device 107 are optionally and/or selectively accessible in parallel. The non-volatile memory devices 107 are generally representative of one type of storage device enabled to communicatively couple to controller 101. However, in various embodiments, any type of storage device is usable, such as SLC (single level cell) NAND flash memory, MLC (multi-level cell) NAND flash memory, TLC (triple level cell) NAND flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium.

In some embodiments, the controller 101 and the non-volatile memory media 103 are implemented on separate integrated circuits. When the controller 101 and the non-volatile memory media 103 are implemented as separate integrated circuits (or devices), the non-volatile memory interface of the controller 101 is generally enabled to manage a plurality of data input/output (I/O) pins and a plurality of control I/O pins. The data I/O pins and the control I/O pins may be configured to connect the device containing the controller 101 to the external devices forming the non-volatile memory media 103. In various embodiments, the controller 101 is implemented as an embedded controller. In various embodiments, the controller 101 and the NVM media 103 implement a solid-state drive (SSD).

The controller 101 also has a command interface configured to receive commands and send responses to the host 105. In embodiments implementing a plurality of non-volatile memory channels, the controller 101 also includes multiplexing circuitry coupling the multiple instances of memory channel controllers to a back-end processing unit (BEPU) providing scheduling and/or data management of the plurality of non-volatile memory devices 107. In further embodiments, the BEPU comprises data buffering and direct memory access (DMA) engines to store data or other information and to move the data or other information between the host 105 and the NVM media 103 using one or more memory channel controllers within the controller 101.

Figure 2:
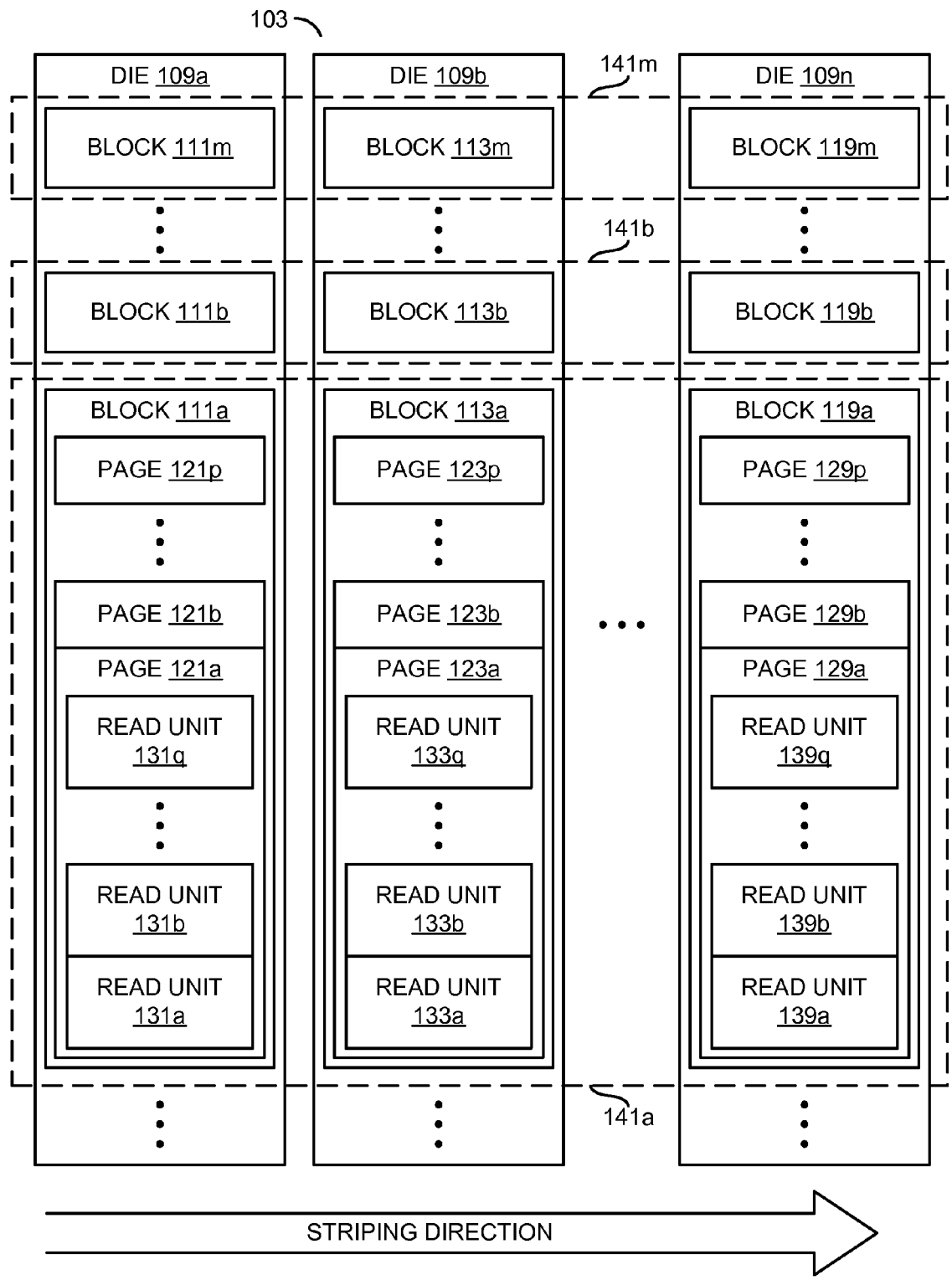
FIG. 2 is a diagram illustrating selected details of an embodiment of die, R-blocks, blocks, R-pages, pages, and e-pages of multiple non-volatile memory devices.

Referring to FIG. 2, a diagram of an example implementation of the NVM media 103 of FIG. 1 is shown illustrating selected details of an embodiment of die, R-blocks, blocks, R-pages, pages, and e-pages of multiple non-volatile memory devices. In one example, the NVM media 103 may comprise multiple non-volatile memory devices embodying a number of blocks, pages, and read units (or e-pages). For example, devices 109a-109n correspond to respective ones of one or more individual flash die. In some embodiments, NVM devices 109a-109n are a portion of the NVM media 103. For example, in various embodiments, data is striped independently across multiple groups of devices, where each of the groups of devices is independently accessible.

Each NVM device (e.g., any one of the devices 109a, 109b, ..., and 109n) provides storage organized as a plurality of NVM blocks (e.g., blocks 111a, 111b, ..., and 111m of device 109a; blocks 113a, 113b, ..., and 113m of device 109b; and so forth). The NVM blocks in turn include a plurality of NVM pages (e.g., pages 121a, 121b, ..., and 121p of block 111a; pages 123a, 123b, ..., and 123p of block 113a; and so forth). The NVM pages in turn comprise a plurality of read units (e.g., read units 131a, 131b, ..., and 131q of page 121a; read units 133a, 133b, ..., and 133q of page 123a; and so forth). Reads and/or writes of information in the devices are performed according to an order, such as a 'read unit first' order or a 'page first' order. An example of a read unit first order for read units illustrated in FIG. 2 begins with read unit 131a followed by units 133a, ..., 139a, 131b, 133b, ..., 139b, and so forth, ending with unit 139q. An example of a page first order for read units illustrated in FIG. 2 begins with read unit 131a followed by units 131b, ..., 131q, 133a, 133b, ..., 133q, 139a, 139b, and so forth, ending with unit 139q.

In various embodiments, the NVM blocks of the NVM media 103 are organized as a plurality of R-blocks (e.g., R-blocks 141a, 141b, ..., 141m). The R-blocks are used as a unit of allocation. The R-blocks comprise n blocks from each die (n being most typically 1 or 2 with current flash devices). In some embodiments, there are b R-blocks (0 to b−1), and R-block k comprises the k'th block from each die. In other embodiments, there are b/2 R-blocks, and R-block k comprises the k'th block and the k+b/2'th block from each die.

The flash die 109a-109n comprise a number of planes (e.g., one, two, four etc.). Each plane comprises a number (e.g., 512, 1024, 2048, etc.) of NVM blocks. Each of the NVM blocks comprises a number of pages, such as 128, 256, or 512 pages. A page is generally the minimum-sized unit that can be independently written, and a block is generally the minimum-sized unit that can be independently erased. In various embodiments, each page of the flash devices 109a-109n comprises a plurality of read units, which may also be referred to as ECC-pages or simply e-pages. Each e-page is an amount of user data and the corresponding ECC data that, together, comprise one ECC codeword (e.g., a correctable unit). Typically, there are an integer number of e-pages per NVM page, or in some embodiments, per multi-plane page. The e-pages are the basic unit that can be read and corrected, hence e-pages are also called "read units." Typically, read units may have 1 KB or 2 KB of user data, and an even share of the remaining bytes in the flash page (so that all read units are the same total size). An e-page (or read unit) is thus the minimum-sized unit that can be independently read (and ECC corrected).

Flash die generally enable multi-plane operations—operating on one or more of the planes in parallel—which improves bandwidths. For this reason, the term NVM block as used herein generally refers to a multi-plane block, such as one block from each of the planes, and the term page as used herein generally refers to a multi-plane page, such as one page from each of the planes. In various embodiments, R-blocks may comprise one or more multi-plane blocks from each die. The R-blocks in turn comprise a plurality of R-pages. An R-page comprises 1 (multi-plane) page from each of the (multi-plane) blocks in the R-block. In some embodiments, there are p R-pages (0 to p−1) and R-page j comprises the j'th page from each of the n blocks in the R-block.

Figure 3:
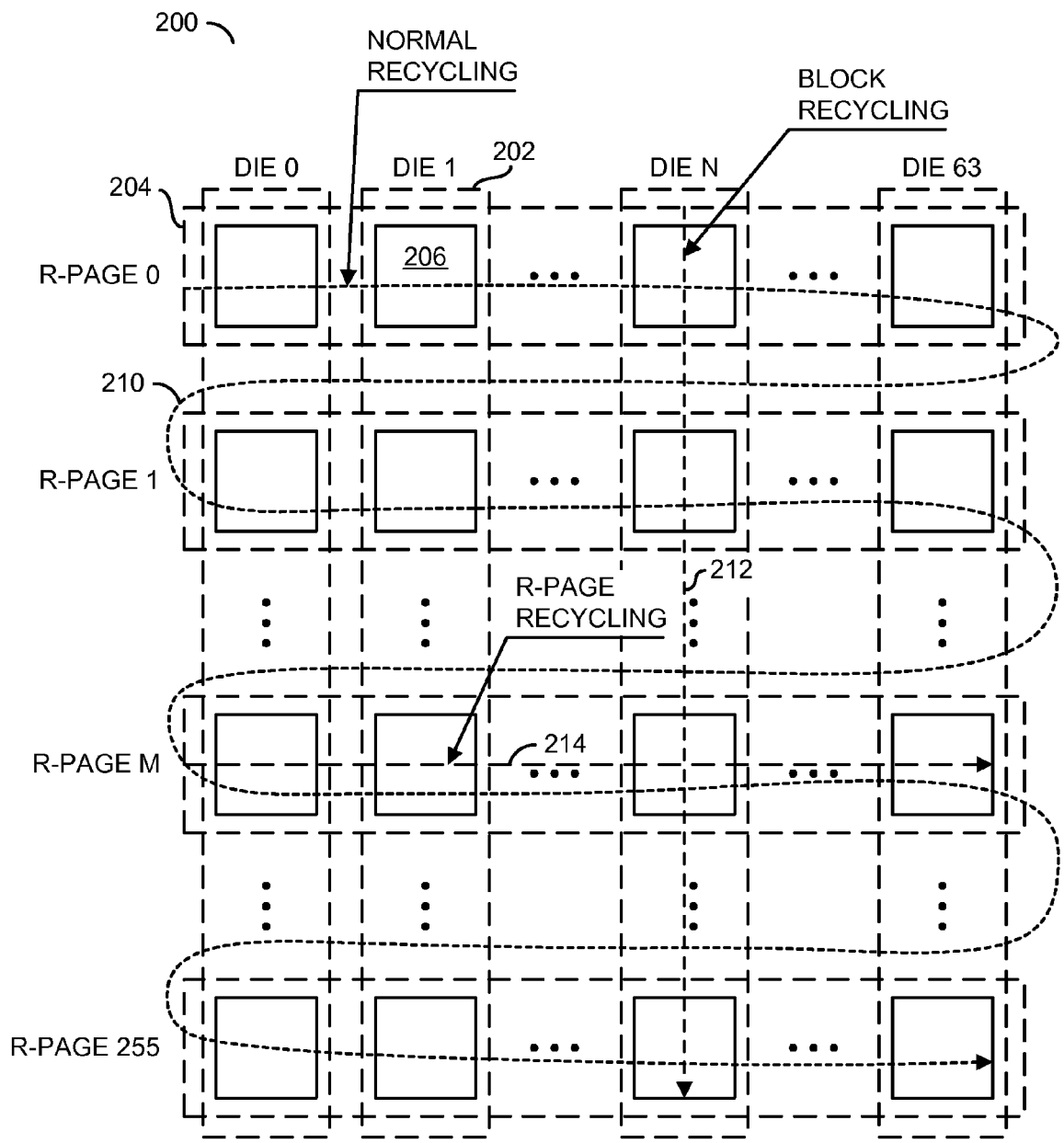
FIG. 3 is a diagram illustrating a variety of R-block recycling operations in accordance with an embodiment of the invention.

Referring to FIG. 3, a diagram of an R-block 200 is shown illustrating a variety of recycling operations in accordance with an embodiment of the invention. A solid-state drive (SSD) device is generally constructed using non-volatile memory (NVM) (e.g., NAND flash) devices. In some embodiments, data is written using R-blocks as a unit of allocation. In one dimension (the vertical dimension in FIG. 3), the R-block 200 comprises one NVM block from each of a plurality of die, such as NVM block 202 from die 1 (64 die are illustrated in FIG. 3). In another dimension (the horizontal dimension in FIG. 3), the R-block 200 comprises a plurality of R-pages 204. Each R-page comprises one page from each of the NVM blocks of the R-block, such as page 206 from NVM block 202 of die 1. The combination of NVM blocks 202 in the R-block 200 are generally controlled to provide cross-die redundancy for higher-level error correction. In some embodiments, an R-block comprises a plurality of NVM blocks from each of the die to reduce the overhead of the cross-die redundancy.

In NAND flash devices, valid data in the media is routinely recycled to other locations. When recycling the R-block 200, a conventional recycling system would process the entire R-block 200. For example, the number of non-volatile memory (NVM) pages 206 within the R-block 200 would be processed at a time until all valid data in the entire R-block 200 is moved to another location (e.g., illustrated by the dashed-line 210). In various embodiments of the invention, recycling operations are selectively performed either on the entire R-block 200, or on a portion less than all of the R-block 200 (deferring recycling operations on other parts of the R-block 200 until a later need). The term portion as used herein generally refers to a part of a larger unit. For example, a portion less than all of the R-block 200 can include, but is not limited to a single non-volatile memory (NVM) block, a portion of a single NVM block, a single R-page, a single e-page, or any combination and/or portion of the preceding. In some embodiments, recycling operations are performed on the entire R-block 200 as part of garbage collection, while recycling operations on the portion less than all of the R-block 200 are performed as part of error handling. For example, block recycling is illustrated by a dashed-line 212 and R-page recycling is illustrated by a dashed-line 214.

Figure 4:
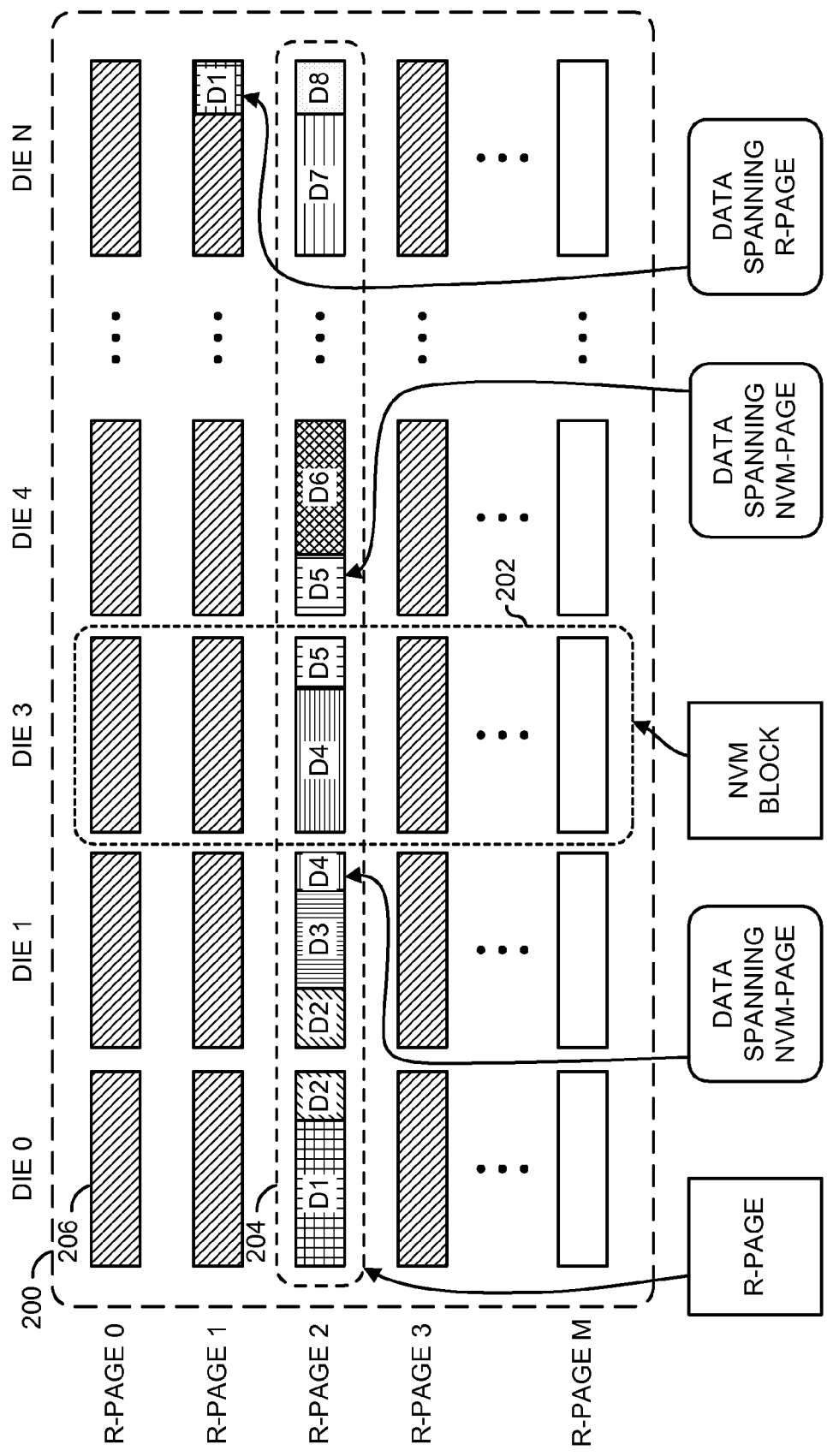
FIG. 4 is a diagram illustrating examples of data units spanning portions of a non-volatile memory block in accordance with an embodiment of the invention.

Referring to FIG. 4, a diagram of a portion of the R-block 200 of FIG. 3 is shown illustrating examples of data units spanning portions of non-volatile memory blocks in accordance with an embodiment of the invention. For example, the data units are compressed versions of fixed-size write data sectors, and the data units are variable in size. A more detailed description of data units can be found in co-pending international application PCT/US2012/058583, international filing date of Oct. 4, 2012, which is incorporated by reference. In some embodiments, host data along with meta-data is written to NVM. The meta-data (e.g., an NVM header) is used to identify the logical address associated with the data (e.g., a logical block address (LEA) corresponding to the host data and/or other information). The recycling procedure in accordance with embodiments of the invention, reads NVM pages 206 starting from one end of a designated R-block 200, such as in the order in which the R-block 200 was written. Metadata within the NVM pages 206 is parsed to determine host LBA and other information which is then used along with mapping information to determine what data units are in the NVM pages 206 and whether the data units are valid or stale. If one of the data units is valid, then the data unit is re-written to another location in another R-block. In various embodiments, the recycling procedure queries the mapping information to determine valid data locations within the designated R-block and re-writes the data elsewhere.

In some operational conditions (e.g., error handling), it is desirable to recycle a portion of the R-block 200, deferring recycling operations on other parts of the R-block 200 until a later need (e.g., a subsequent error, or a decision to recycle the entire R-block). In some embodiments, a recycle operation is performed to recycle a portion less than the all of the R-block 200, such as one NVM block 202, one R-page 204, one NVM page 206, a portion of an NVM page 206 (e.g., one or more e-pages), or any combination and/or portion of the preceding. The recycling can be done at very fine granularity (e.g., one NVM block, part of the NVM block, one R-page, one page or even a single e-page). In some usage models, data units within the NVM locations destined to be recycled may span several NVM pages. For example, data units can cross beyond the NVM block that is being recycled (e.g., as illustrated by data units D1, D2, D4 and D5). A recycling process in accordance with an embodiment of the invention specifically detects and handles these conditions in order to ensure that the an entire valid data unit contained at least partially inside the entity being recycled is moved elsewhere.

In some usage cases, a NVM block may be selected to be recycled for various reasons (e.g., for read disturb handling, program (write) error handling, etc.). The selected NVM block is one block within a set of blocks that make up the R-block 200 (e.g., NVM block 202 as illustrated in FIG. 3). Within the selected NVM block, there may be some valid data as well as invalid or stale data. Only the valid data needs to be recycled. The stale data can be ignored. Redundancy data (e.g., for a higher level redundancy function such as a RAID-like code, etc.) does not need to be recycled since the redundancy function will be recomputed as part of writing a destination R-block of the recycling. Data in the rest of the R-block 200 is also not recycled, except as required to fully recycle data units that span outside of the selected NVM block.

In some embodiments, data units within the selected NVM block may span to a neighboring NVM block. Data units spanning to a neighboring NVM block can happen because data is written sequentially within an R-Block in an order that spans NVM blocks. In these conditions, the recycling process ensures all portions of any data units that are at least partly within the selected NVM block are recycled.

Partial R-Block recycling in accordance with embodiments of the invention may be illustrated by, but is not limited to the following examples:

1. When an NVM page program fails, the NVM block containing the failed page can no longer be used. Any data already written into that NVM block needs to be moved elsewhere quickly. It is much more efficient to move the data by partial block recycling of the portion of the NVM block that has already been written, rather than other techniques such as copying the NVM block to a replacement block, which requires a physical block mapping scheme.

2. When an NVN page program fails, the data in the same R-page is potentially more vulnerable to other errors since some of the higher-level redundancy (e.g., RAID-like redundancy, etc.) including that page is now "used up" to correct that failed page. In cases such as this, recycling an R-page is the most efficient way to quickly restore the highest degree of data integrity.

3. In systems using soft-decision decoding, when an NVM page (or a portion thereof, such as one e-page) fails hard-decision decoding and is only correctable with more time/effort using soft-decision techniques, it is beneficial to recycle just the affected NVM page (or portion thereof). This prevents that copy of the data from being read a second time (thus avoiding the need to repeatedly apply soft-decision decoding to the same NVM page).

4. In systems where Bit Error Rate (BER) and/or Read Disturb Counter are used to determine whether some parts of the media (e.g., NVM blocks or groups thereof) are becoming less reliable, data needs to be moved out of the less reliable NVM block(s) (e.g., by recycling the less reliable NVM block(s)) instead of recycling the entire R-Block(s) that contain the less reliable NVM block(s).

Figure 5:
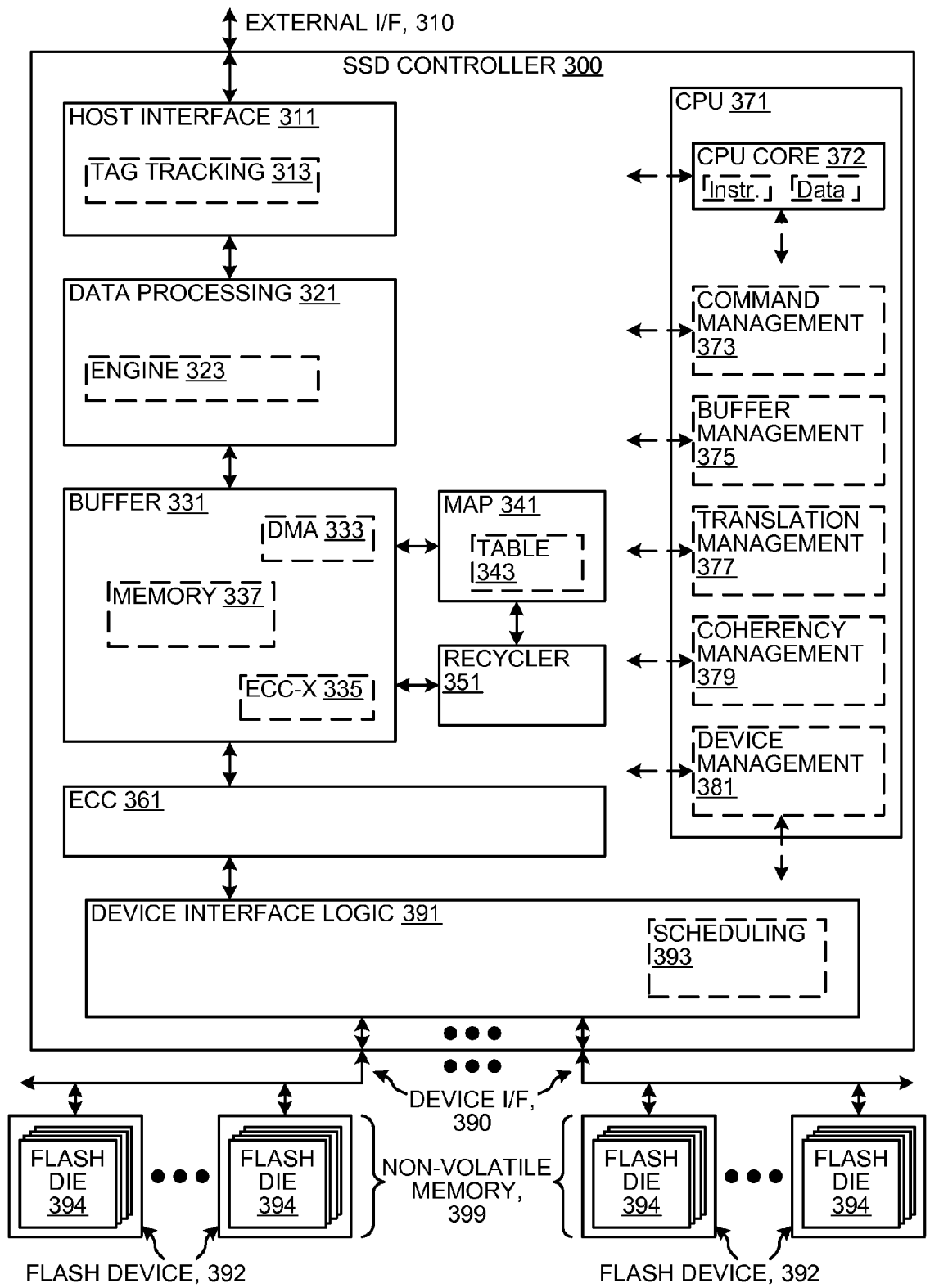
FIG. 5 is a diagram illustrating a flash controller in accordance with an embodiment of the invention.

Referring to FIG. 5, a diagram is shown illustrating a solid-state disk (SSD) including an SSD controller 300 in which a partial R-block recycling technique in accordance with an embodiment of the invention may be implemented to migrate data in non-volatile (e.g., flash) memory before an error rate becomes too high to correct. The SSD controller 300 may be coupled via one or more external interfaces 310 to a host (not shown). According to various embodiments, external interfaces 310 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the SSD controller 300 includes a SATA interface and a PCIe interface.

The SSD controller 300 is further coupled via one or more device interfaces 390 to non-volatile memory 399 including one or more storage devices, such as flash devices 392. According to various embodiments, device interfaces 390 are one or more of: an asynchronous interface; a synchronous interface; a DDR synchronous interface; an ONFI compatible interface, such as an ONFI 2.2 compatible interface; a Toggle-mode compatible flash interface; a non-standard version of any of the preceding interfaces; a custom interface; or any other type of interface used to connect to storage devices.

The Flash devices 392 have, in some embodiments, one or more individual flash die 394. According to a type of a particular one of the flash devices 392, a plurality of flash die 394 in the particular flash device 392 are optionally and/or selectively accessible in parallel. The Flash devices 392 are generally representative of one type of storage device enabled to communicatively couple to SSD controller 300. However, in various embodiments, any type of storage device is usable, such as an SLC (single level cell) NAND flash memory, MLC (multi-level cell) NAND flash memory, TLC (triple level cell) NAND flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), or any other type of memory device or storage medium.

According to various embodiments, the device interfaces 390 are organized as: one or more busses with one or more flash devices 392 per bus; one or more groups of busses with one or more flash devices 392 per bus, where busses in a group are generally accessed in parallel; or any other organization of flash devices 392 coupled to device interfaces 390.

The SSD controller 300 may have one or more modules, such as a host interface module 311, a data processing module 321, a buffer 331, a map 341, a recycler 351, an error-correcting code (ECC) module 361, a central processing unit (CPU) 371, and device interface logic 391. The specific modules and interconnections illustrated in FIG. 5 are merely representative of one embodiment, and many arrangements and interconnections of some or all of the modules, as well as additional modules not illustrated, may be implemented to meet the design criteria of a particular implementation. In a first example, in some embodiments, there are two or more host interfaces 311 to provide dual-porting. In a second example, in some embodiments, the data processing module 321 and/or the ECC module 361 are combined with the buffer 331. In a third example, in some embodiments, the host interfaces 311 are directly coupled to the buffer 331, and the data processing module 321 optionally and/or selectively operates on data stored in the buffer 331. In a fourth example, in some embodiments, the device interface logic 391 is directly coupled to the buffer 331, and the ECC module 361 optionally and/or selectively operates on data stored in the buffer 331.

The host interface 311 sends and receives commands and/or data via the external interface 310, and, in some embodiments, tracks progress of individual commands via the tag tracking module 313. For example, the commands include a read command specifying an address (such as an LBA) and an amount of data (such as a number of LBA quanta, e.g. sectors) to read; in response the SSD provides read status and/or read data. For another example, the commands include a write command specifying an address (such as an LBA) and an amount of data (such as a number of LBA quanta, e.g. sectors) to write; in response the SSD provides write status and/or requests write data and optionally subsequently provides write status. In some embodiments, the host interface 311 is compatible with a SATA protocol and, using NCQ commands, is enabled to have up to 32 pending commands, each with a unique tag represented as a number from 0 to 31. In some embodiments, the tag tracking module 313 is enabled to associate an external tag for a command received via the external interface 310 with an internal tag used to track the command during processing by SSD controller 300.

According to various embodiments, one or more of: data processing module 321 optionally and/or selectively processes some or all data sent between the buffer 331 and the external interfaces 310; and data processing module 321 optionally and/or selectively processes data stored in the buffer 331. In some embodiments, the data processing module 321 uses one or more engines 323 to perform one or more of: encrypting; decrypting; compressing; decompressing; formatting; reformatting; transcoding; and any other data processing and/or manipulation task.

The buffer 331 stores data sent to/from the external interfaces 310 from/to the device interfaces 390. In some embodiments, the buffer 331 additionally stores system data, such as some or all map tables, used by the SSD controller 300 to manage the flash devices 392. In various embodiments, the buffer 331 has one or more of: a memory 337 used for temporary storage of data; a direct memory access (DMA) modules 333 used to control movement of data to and/or from the buffer 331; an ECC-X module 335 used to provide a higher-level error correction function; and other data movement and/or manipulation functions. An example of a higher-level error correction function is a RAID-like capability, where redundancy is at a flash device (e.g. multiple ones of the flash devices 392) level and/or a flash die (e.g. flash die 394) level instead of at a disk level.

According to various embodiments, one or more of: the ECC module 361 optionally and/or selectively processes some or all data sent between the buffer 331 and the device interfaces 390; and the ECC module 361 optionally and/or selectively processes data stored in the buffer 331. In some embodiments, the ECC module 361 implements one or more of: a CRC (cyclic redundancy check) code; a Hamming code; an RS (Reed-Solomon) code; a BCH code; an LDPC (Low-Density Parity Check) code; a Viterbi code; a trellis code; a hard-decision code; a soft-decision code; an erasure-based code; any error detecting and/or correcting code; and any combination of the preceding.

The device interface logic 391 controls the flash devices 392 via the device interfaces 390. The device interface logic 391 is enabled to send data to/from the flash devices 392 according to a protocol of the flash devices 392. The device interface logic 391 includes a scheduling module 393 to selectively sequence control of the flash devices 392 via the device interfaces 390. For example, in some embodiments, the scheduling module 393 is enabled to queue operations to the flash devices 392, and to selectively send the operations to individual ones of the flash devices 392 (or the flash die 394) as individual flash devices 392 (or flash die 394) are available.

The map 341 converts between data addressing used on the external interfaces 310 and data addressing used on the device interfaces 390, using table 343 to map external data addresses to locations in the non-volatile memory 399. For example, in some embodiments, the map 341 converts logical block addresses (LBAs) used on the external interfaces 310 to block and/or page addresses targeting one or more flash die 394, via mapping provided by table 343. In some embodiments, a granularity of map 341 is fixed, such as mapping first fixed-sized logical blocks used on the external interfaces 310 to second fixed-sized blocks used on the device interfaces 390. In other embodiments, a granularity of map 341 is variable and not all blocks used on either the external interfaces 310 or the device interfaces 390 are necessarily a same size.

In some embodiments, table 343 associates logical page addresses with a respective map entry, where the logical page addresses are a portion of and/or are derived from the LBA, and the map entry identifies a portion of the non-volatile memory. For example, in some embodiments, the logical page address is a higher-order portion of the LBA, and a lower-order portion of the LBA is an offset within a logical page specified by the logical page address.

In some embodiments, the map entry identifies the portion of the non-volatile memory as a base address, such as a read unit address, and a length, such as a number of read units. In some embodiments, the read units are sequential in locations in an address space of the non-volatile memory. In further embodiments, the read units are striped across a plurality of flash die (such as flash die 394) and/or flash devices (such as flash devices 392).

In some embodiments, map 341 uses table 343 to perform and/or to look up translations between addresses used on the external interfaces 310 and data addressing used on the device interfaces 390. According to various embodiments, table 343 is one or more of: a one-level map; a two-level map; a multi-level map; a map cache; a compressed map; any type of mapping from one address space to another; and any combination of the foregoing. According to various embodiments, table 343 includes one or more of: static random access memory (SRAM); dynamic random access memory (DRAM); non-volatile memory (such as flash memory); cache memory; on-chip memory; off-chip memory; and any combination of the foregoing.

In some embodiments, the recycler module 351 performs garbage collection. For example, in some embodiments, flash devices 392 contain blocks that must be erased before the blocks are re-writeable. The recycler module 351 is enabled to determine which portions of the flash devices 392 are actively in use, such as by scanning a map maintained by map 341, and to make unused portions of flash devices 392 available for writing by erasing them. In further embodiments, the recycler module 351 is enabled to move data stored within the flash devices 392 to make larger contiguous portions of the flash devices 392 available for writing.

The CPU 371 controls various portions of SSD controller 300. The CPU 371 includes a CPU core 372. The CPU core 372 is, according to various embodiments, one or more single-core or multi-core processors. The individual processor cores in the CPU core 372 are, in some embodiments, multi-threaded. The CPU core 372 includes instruction and/or data caches and/or memories. For example, the instruction memory contains instructions to enable the CPU core 372 to execute software (sometimes called firmware) to control the SSD controller 300. In some embodiments, some or all of the firmware executed by the CPU core 372 is stored on the flash devices 392.

In various embodiments, the CPU 371 further includes: a command management module 373 to track and control commands received via the external interfaces 310 while the commands are in progress; a buffer management module 375 to control allocation and use of the buffer 331; a translation management module 377 to control the map 341; a coherency management module 379 to control consistency of data addressing and to avoid conflicts such as between external data accesses and recycle data accesses; a device management module 381 to control device interface logic 391; and optionally other management units. In one example, the device management module 381 may be configured to initiate and/or implement a partial R-block recycling process in accordance with embodiments of the invention. None, any, or all of the management functions performed by the CPU 371 are, according to various embodiments, controlled and/or managed by hardware, by firmware, by software (such as software executing on the CPU core 372 or on a host connected via the external interfaces 310), or any combination thereof. For example, the recycler module 351 and the device management module 381 may be implemented as part of the CPU 371, or could be implemented in hardware, or could be implemented by a combination of firmware running on the CPU 371 and hardware.

In some embodiments, the CPU 371 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to the SSD controller 300 and is compatible with operation with various computing hosts, such as via adaptation of the host interface 311 and/or the external interface 310. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

In various embodiments, all or any portion of an SSD controller 300 (or a computing-host flash memory controller) are implemented on a single integrated circuit (IC), a single die of a multi-die IC, a plurality of dice of a multi-die IC, or a plurality of ICs. For example, the buffer 331 is implemented on a same die as other elements of the SSD controller 300. For another example, the buffer 331 is implemented on a different die than other elements of SSD controller 300.

Figure 6:
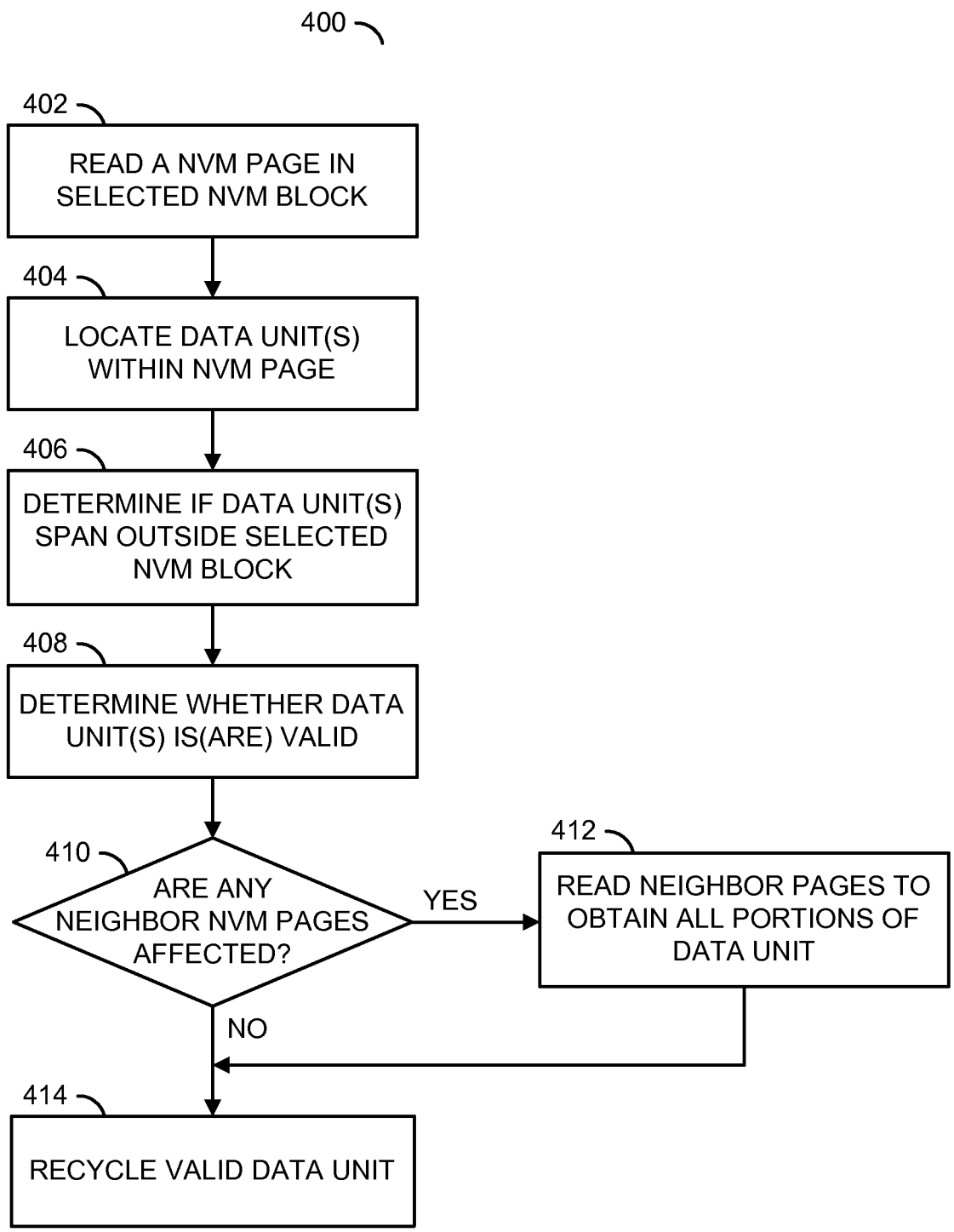
FIG. 6 is a diagram illustrating a recycling process in accordance with an embodiment of the invention.

Referring to FIG. 6, a diagram is shown illustrating a process 400 for recycling NVM blocks in accordance with an embodiment of the invention. The process (or method) 400 may be used to handle each NVM page of the selected NVM block. The NVM pages within the selected NVM block can be read in any order, but reading in a same order as the NVM pages were written is, in some embodiments, simpler. Multiple NVM pages can be processed concurrently. In some usage cases, only a part of the NVM block is recycled either because the NVM block is only written partially, or only selected pages in the NVM block need to be recycled.

In some embodiments, the process 400 may comprise a step (or state) 402, a step (or state) 404, a step (or state) 406, a step (or state) 408, a step (or state) 410, a step (or state) 412, and a step (or state) 414. In the step 402, the process 400 may read the NVM page in the selected NVM block. The read may include application of any error correction needed to recover data in the NVM page in case there is an error in the data read. In the step 404, the process 400 locates data units within the NVM page (e.g., using meta-data or NVM headers). In the step 406, the process 400 determines whether data units in the NVM page span outside the selected NVM block. The spanning can be in either direction (e.g., data units starting in previous blocks, and/or data units continuing into subsequent blocks). In some embodiments, meta-data within the data can indicate spanning of data units. In these cases, the meta-data is parsed to determine spanning (e.g., determine if previous and/or subsequent blocks are needed). In other embodiments, map information may be implemented for each of the data units that indicates spanning so only a map lookup is needed.

In the step 408, the process 400 determines which data units are valid. In embodiments where map information is implemented, the process 400 uses the map information obtained via map lookup to determine which data units are valid. In the step 410, if a data unit is valid, the process 400 also determines which, if any, neighbor (outside of the selected NVM block) NVM pages are affected. In some embodiments, the neighbor NVM pages are calculated based on worst case spanning conditions rather than from map or meta-data information. For example, knowing the maximum size of a data unit, a worst-case spanning is determinable, and sufficient blocks (and/or NVM pages) prior to and/or subsequent to the NVM block selected for recycling can be read in advance. If neighbor NVM pages are affected, the process 400 moves to the step 412. Otherwise, the process 400 moves to the step 414.

In the step 412, the process 400 reads the neighbor NVM pages (if not pre-read) so all data unit portions are available as well as any related meta-data associated with the spanned data units. Error correction may be applied to recover the data as needed. When the neighbor NVM pages have been read, the process 400 moves to the step 414.

In the step 414, the process 400 recycles the valid data units by re-writing the data units to another NVM location outside the area being recycled (e.g., another R-block). In embodiments where map information is implemented, the process 400 also updates the map information with a new location and size for each data unit being rewritten after the re-write (as in other recycling processes). In some embodiments, such as embodiments where headers in e-pages contain meta-data for data starting in each e-page, the steps 410 and 412 are performed prior to the step 408 so that the headers associated with any data units requiring recycling are available prior to determining whether the data units are valid, such as via a map lookup.

Figure 7:
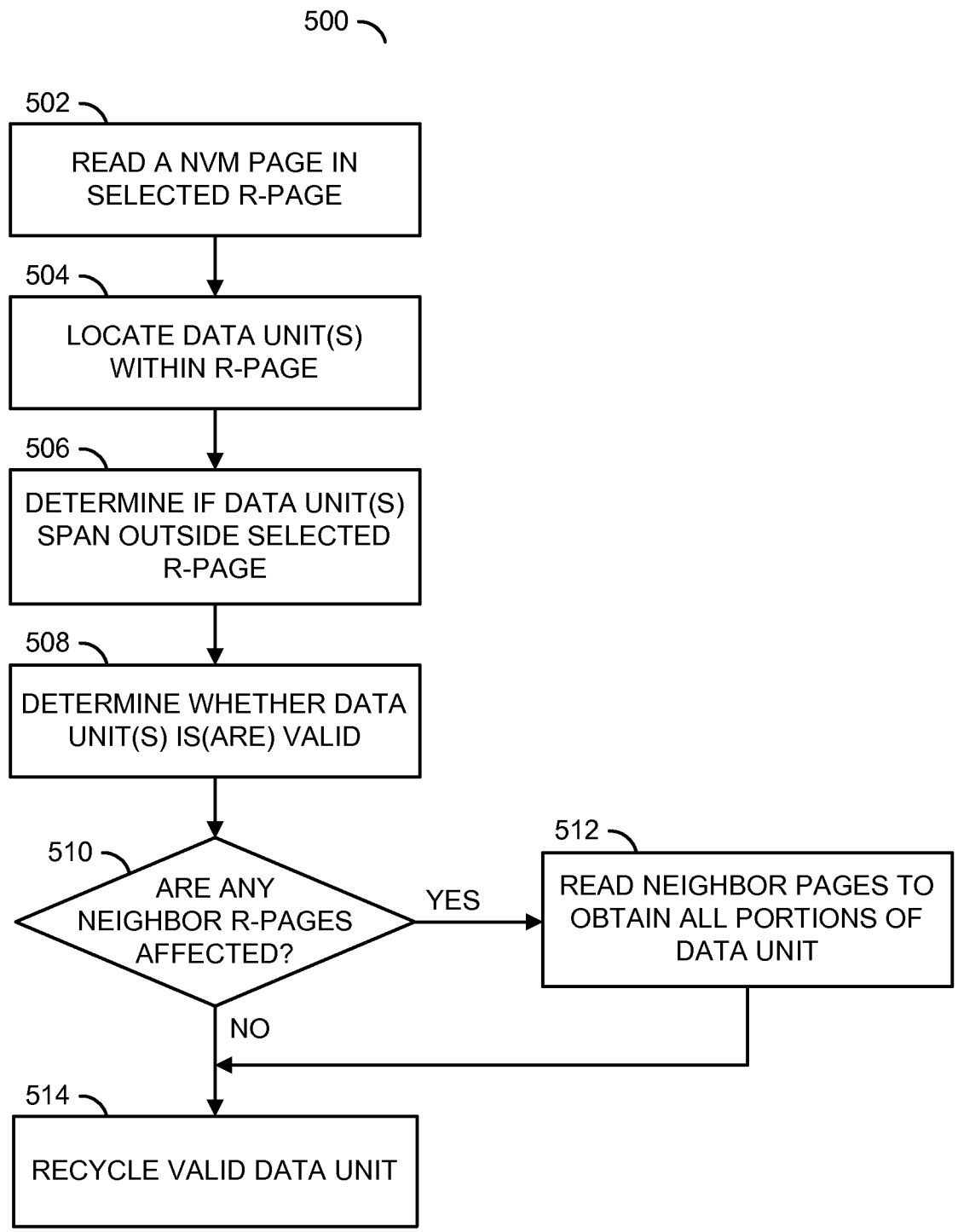
FIG. 7 is a diagram illustrating another recycling process in accordance with an embodiment of the invention.

Referring to FIG. 7, a diagram is shown illustrating a process 500 for recycling a single R-page in accordance with an embodiment of the invention. The process (or method) 500 may be used to handle each R-page selected for recycling. An R-page is a set of NVM pages (e.g., one page from each of a plurality of NVM blocks) and each neighbor R-page as defined by the write order comprises a different set of NVM pages from the same NVM blocks. Also, an R-page may contain cross-die or cross-block redundancy. In some embodiments, the process 500 may comprise a step (or state) 502, a step (or state) 504, a step (or state) 506, a step (or state) 508, a step (or state) 510, a step (or state) 512, and a step (or state) 514.

In the step 502, the process 500 may read each NVM page in the selected R-page. The NVM pages in the selected R-page can be read in sequence or concurrently. The read may include application of error correction as needed to recover data in the NVM page in case there is an error in the data read. In the step 504, the process 500 locates data units within the NVM page(s) (e.g., using meta-data). In the step 506, the process 500 determines whether data units in the NVM page span outside the selected R-page. In some embodiments, meta-data within the data can indicate spanning of data units. In these cases, the meta-data is parsed to determine spanning (e.g., determine if previous and/or subsequent data from previous and/or subsequent R-pages are needed). In other embodiments, map information may be implemented for each of the data units that indicates spanning, so only a map lookup is needed.

In the step 508, the process 500 determines which data units are valid. In embodiments where map information is implemented, the process 500 uses the map information obtained via map lookup to determine which data units are valid. In the step 510, if a data unit is valid, the process 500 also determines which, if any, neighbor (outside of the selected R-page) NVM pages are affected. In some embodiments, knowing the maximum size of a data unit, a worst-case spanning is determinable, and sufficient NVM pages prior to and/or subsequent to the R-page being recycled could be read in advance. If neighbor NVM pages are affected, the process 500 moves to the step 512. Otherwise, the process 500 moves to the step 514.

In the step 512, the process 500 reads the neighbor NVM pages so all data unit portions as well as any related meta-data associated with the spanned data units are available. Error correction may be applied to recover the data as needed. When the neighbor NVM pages have been read, the process 500 moves to the step 514.

In the step 514, the process 500 recycles the valid data units by re-writing the data units to another NVM location such as another R-block. In embodiments where map information is implemented, the process 500 also updates map information as part of the re-write (as in other recycling processes).

In some embodiments, such as embodiments where headers in e-pages contain meta-data for data starting in each epage, the steps 510 and 512 are done prior to the step 508 so that the headers associated with any data units requiring recycling are available prior to determining whether the data units are valid, such as via a map lookup.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a non-volatile memory comprising a plurality of R-blocks; and
    a controller coupled to said non-volatile memory, wherein said controller is configured to (i) write data using said R-blocks as a unit of allocation and (ii) perform recycling operations selectively on either an entire one of said R-blocks or a portion less than all of one of said R-blocks.

2. The apparatus according to claim 1, wherein said controller is further configured to perform said recycling operations on said entire one of said R-blocks as part of garbage collection.

3. The apparatus according to claim 1, wherein said controller is further configured to perform said recycling operations on said portion less than all of one of said R-blocks as part of error handling.

4. The apparatus according to claim 3, wherein:
    said error handling is enabled in response to detection of a program error in a block of said non-volatile memory; and
    said portion less than all of one of said R-blocks is a portion of said block of said non-volatile memory.

5. The apparatus according to claim 3, wherein:
    said error handling is enabled in response to detection of a program error in a block of said non-volatile memory; and
    said portion less than all of one of said R-blocks is an R-page.

6. The apparatus according to claim 3, wherein:
    said error handling is enabled in response to detection of a read disturb condition of a block of said non-volatile memory; and
    said portion less than all of one of said R-blocks is said block of said non-volatile memory affected by said read disturb condition.

7. The apparatus according to claim 1, wherein said controller is configured to perform said recycling operations on a granularity less than that of an entire one of said R-blocks by performing said recycling operations on said portion less than all of one of said R-blocks.

8. The apparatus according to claim 1, wherein:
    said portion less than all of one of said R-blocks comprises a plurality of pages of said non-volatile memory, with said plurality of pages storing at least a portion of one or more valid data items; and
    said controller is configured to perform said recycling operations on said portion less than all of one of said R-blocks by making a determination whether a particular one of said one or more valid data items spans into or out of the portion less than all of one of said R-blocks and, based upon the determination, selectively performing recycling operations that recycle all of the one or more valid data items.

9. The apparatus according to claim 1, wherein said portion less than all of one of said R-blocks comprises at least one of a single non-volatile memory block, a portion of said single non-volatile memory block, a single R-page, a single e-page.

10. A method for recycling non-volatile memory (NVM) blocks in an R-block comprising the steps of:
reading a NVM page in a selected NVM block;
locating data unit within said NVM page;
determining whether said data unit within said NVM page spans outside said selected NVM block;
determining whether said data unit is valid;
if said data unit is valid, also determining which, if any, neighbor NVM pages are affected;
if neighbor NVM pages are affected, reading any neighbor NVM pages so all portions of said data unit are available along with any related meta-data associated with the span of said data unit;
recycling the valid data unit by re-writing the data unit to another NVM location outside the area being recycled.

11. The method according to claim 10, wherein said R-block comprises a combination of NVM blocks providing cross-die redundancy for error correction.

12. The method according to claim 10, wherein said span of said data unit comprises one or both of (i) a data unit starting in one or more previous NVM blocks and (ii) a data unit continuing into one or more subsequent NVM blocks.

13. The method according to claim 12, wherein meta-data within the data indicates spanning of data units.

14. The method according to claim 13, further comprising parsing the meta-data to determine whether previous NVM blocks, subsequent NVM blocks, or both previous and subsequent NVM blocks are needed.

15. The method according to claim 10, further comprising calculating the neighbor NVM pages based on worst case spanning conditions.

16. A method for recycling a single R-page comprising:
reading one or more NVM pages in a selected R-page;
locating data units within the one or more NVM pages;
determining if data units in the one or more NVM pages span outside the selected R-page;
determining which data units are valid;
for each data unit that is valid, also determining which neighbor NVM pages are affected;
if neighbor NVM pages are affected, reading the neighbor NVM pages so all portions of said data units along with any related meta-data associated with the span of data units are available;
recycling the valid data units by re-writing the data units to another NVM location.

17. The method according to claim 16, wherein said R-page comprises a set of NVM pages and each neighbor NVM page as defined by a write order can be on one or both of a different NVM block and a different NVM die.

18. The method according to claim 16, wherein said R-page contains cross-die or cross-block redundancy.

19. The method according to claim 16, wherein the NVM pages in the selected R-page are read in sequence or concurrently.

20. The method according to claim 16, further comprising updating the map information with a new location and size for each data unit being rewritten after the re-write.

\* \* \* \* \*